US006907596B2

(12) United States Patent
Kobayashi et al.

(10) Patent No.: US 6,907,596 B2
(45) Date of Patent: Jun. 14, 2005

(54) MASK DATA GENERATING APPARATUS, A COMPUTER IMPLEMENTED METHOD FOR GENERATING MASK DATA AND A COMPUTER PROGRAM FOR CONTROLLING THE MASK DATA GENERATING APPARATUS

(75) Inventors: Sachiko Kobayashi, Chiba-ken (JP); Toshiya Kotani, Kanagawa-ken (JP); Satoshi Tanaka, Kanagawa-ken (JP); Susumu Watanabe, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 106 days.

(21) Appl. No.: 10/385,624

(22) Filed: Mar. 12, 2003

(65) Prior Publication Data

US 2003/0188288 A1 Oct. 2, 2003

(30) Foreign Application Priority Data

Mar. 27, 2002 (JP) .................................... P 2002-090060

(51) Int. Cl.[7] ............................................ G06F 17/50
(52) U.S. Cl. .............................. 716/19; 716/20; 716/21
(58) Field of Search ..................... 716/19–21; 382/199; 250/559.26

(56) References Cited

U.S. PATENT DOCUMENTS

| 6,077,310 | A | * | 6/2000 | Yamamoto et al. ............ 716/19 |
| 6,243,855 | B1 | | 6/2001 | Kobayashi et al. ............ 716/19 |
| 6,539,521 | B1 | * | 3/2003 | Pierrat et al. .................... 716/4 |
| 6,570,174 | B1 | * | 5/2003 | Tounai et al. ........... 250/559.26 |
| 6,647,147 | B1 | * | 11/2003 | Miyano ........................ 382/199 |
| 2002/0043615 | A1 | * | 4/2002 | Tounai et al. ................ 250/221 |
| 2002/0047089 | A1 | * | 4/2002 | Tounai et al. ................ 250/221 |
| 2003/0093767 | A1 | * | 5/2003 | Murai et al. ................... 716/21 |
| 2004/0073885 | A1 | * | 4/2004 | Ohnuma et al. ............... 716/19 |

OTHER PUBLICATIONS

Harafuji et al. "A Novel Hierarchical Approach for Proximity Effect Correction in Electron Beam Lithography," IEEE Transactions on Computer–Aided Design of Integrated Circuits and Systems, vol. 12, No. 10, Oct. 1993, pp. 1508–1514. ☐☐☐☐*
John P. Stirniman, Michael L. Riger, "Fast proximity correction with zone sampling", 8 pages, Proc. SPIE, vol. 2197, (May 1994).
Michael L. Riger, John P. Stirniman, "Using behavior modelling for proximity correction", 6 pages, Proc. SPIE, vol. 2197, (May 1994).

* cited by examiner

Primary Examiner—Vuthe Siek
Assistant Examiner—Naum Levin
(74) Attorney, Agent, or Firm—Finnegan, Henderson, Farabow, Garrett & Dunner, L.L.P.

(57) ABSTRACT

A mask data generating apparatus comprising: a division module configured to extract a line segment and dividing the extracted line segment into a suitable length; a correction value calculation module configured to calculate correction value calculating points from each divided edge; a first calculated center point calculation module configured to set first calculated center points and a shape of a pattern; a first rectangular region preparation module configured to prepare first simulation regions and a plurality of first rectangular regions which overlap with each other; a second calculated center point calculation module configured to acquire second rectangular regions, and calculating second calculated center points based on the second rectangular regions; a second simulation region preparation module configured to acquire second simulation regions; a process simulation execution module configured to calculate a correction value; and a correction pattern preparation module configured to prepare the correction pattern.

15 Claims, 18 Drawing Sheets

FIG.9

| | NUMBER OF CORRECTION CENTER POINTS | AFTER PATTERN MATCHING | OPC TIME |
|---|---|---|---|
| CONVENTIONAL EXAMPLE | 3133 POINTS | 2149 POINTS | 21392 SECONDS |
| EXAMPLE | 552 POINTS | 491 POINTS | 3233 SECONDS |
| REDUCTION RATE | 82% | 77% | 85% |

MASK DATA GENERATING APPARATUS, A COMPUTER IMPLEMENTED METHOD FOR GENERATING MASK DATA AND A COMPUTER PROGRAM FOR CONTROLLING THE MASK DATA GENERATING APPARATUS

CROSS REFERENCE OF RELATED APPLICATIONS

This application is based upon and claims the benefit of priority from prior Japanese Patent Application P2002-090060 filed Mar. 27, 2002, the entire contents of which are incorporated herein by reference.

BACKGROUND OF THE INVENTION

1. Field of the Invention

The present invention relates to optical and X-ray lithography technologies applied for manufacturing a semiconductor integrated circuit, a liquid crystal panel and the like, more particularly to a mask data generating apparatus, a computer implemented method for generating mask data and a computer program for controlling the mask data generating apparatus for performing correction processing of mask data.

2. Description of the Related Art

In a lithography technology used for manufacturing a semiconductor integrated circuit, the degree of integration of devices merged in a wafer has increased year by year, thus reducing a design rule thereof. Accordingly, optical proximity effect has been a significant problem. The optical proximity effect is a phenomenon that, when advanced miniaturization of a design pattern causes patterns to come in proximity to each other by approximately a wavelength of light or under a wavelength of light, the patterns are not transferred in accordance with designed shape and dimension on the wafer. "Optical proximity effect" was a term originally used regarding an effect caused by optical factors in pattern transfer; however, nowadays, it generally means an effect caused throughout an entire wafer processes.

In order to achieve a desired device performance, it is necessary to realize desired dimension and shape of the design pattern with predetermined precision on the wafer. Consequently, optical proximity effect correction (OPC) has been keenly studied in recent years, in which a pattern deviation occurs in process is previously compensated on a mask. OPC has been extensively studied as one type of resolution enhancement technologies (RET), and thus various techniques are now proposed and implemented.

In OPC, each edge of correction target pattern is divided in appropriate length, and a correction value is calculated regarding each divided edge. The correction value is acquired by iteranting a process simulation on arrangement in the vicinity of the edge to be corrected. In a layout of a critical design rule, spots that require correction to satisfy a desired precision have a tendency to increase. Thus, the number of times of performing the process simulation is increased, and as a result, a lot of time is needed for correction calculations. Accordingly, there is an urgent need to reduce calculating time. In consideration for the above situation, it is necessary to shorten correction time by efficiently grouping the point on which the process simulation for correction value calculation is performed and by calculating all at once in OPC.

According to the paper titled "First Proximity Collection With Zone Sampling", described in Optical Laser Microlithography VII (Proc. SPIE Vol. 2197, p.p. 294 to 301) and the paper titled "Using Behavior Modeling For Proximity Collection", described in the same (Proc. SPIE Vol. 2197, p.p. 371 to 376) published in May 1994, when optical proximity effect correction is performed for input data, each edge of a pattern to be corrected is divided into an appropriate size, and a correction value calculating point (a target point) is set for each divided edge. Moreover, the correction value at each correction value calculating point is acquired by performing process simulation with respect to a small area of about 2 to 4 µm in the vicinity of the point for each point. A correction target pattern is prepared by performing pattern data processing in which the correction value calculated at the correction value calculating point is applied to each divided edge and each edge thereof is moved.

The above-described technique will be described more concretely below. A pattern to be corrected is selected as shown in FIG. 1A, and each edge of this pattern to be corrected is divided based on a specified method as shown in FIG. 1B. Then, as shown in FIG. 1C, a point for calculating a correction value (hereinafter referred to as a "correction value calculating point") is set for each divided edge. The correction value at each correction value calculating point is acquired by using the process simulation. In order to acquire a correction value of an edge 41 in FIG. 1C, for example, a point 42 is taken as the correction value calculating point, and the process simulation is performed with respect to a small area in the vicinity of the point 42 (a process simulation radius 43) as shown in FIG. 1D. The correction target pattern is prepared by performing pattern data processing in which the correction value is calculated by repeating the process simulation as needed, the correction value calculated at each correction value calculating point is applied to each edge and each edge is moved.

However, in a layout of a critical design rule, since the edge of the pattern is divided into minute pieces for high-precision correction thereof, the number of correction value calculating points is increased. In response to this increase, the number of times of executing the process simulation is also increased. As a result, a lot of time is required for correction calculation. Moreover, in order to calculate the correction values in one point, it is necessary to perform the simulation by overlapping arrangements in the vicinity of the points. Consequently, for example, in the case where the correction value calculating points are densely arranged such as in a memory cell, a memory cell peripheral portion and a cell wiring portion, the simulation is redundantly performed a plurality of times for the same region, leading to an increase in the simulation time. As a result, a data processing time is inevitably increased.

The inventors of this application found out the following. Specifically, that the simulation time can be shortened and the correction value calculating points can be calculated at a higher speed, by grouping the correction value calculating points into a fixed rectangular region and by performing the grouping into the rectangular region at a plurality of spots.

SUMMARY OF THE INVENTION

According to a first aspect of the present invention, a mask data generating apparatus comprises: (a) a division module for extracting a line segment to be corrected from a design pattern, and dividing the extracted line segment to be corrected into a length suitable for correction; (b) a correction value calculation module for calculating correction value calculating points from each divided edge; (c) a first calculated center point calculation module for setting first calculated center points based on the correction value calculating points and a shape of a pattern to be corrected; (d) a first rectangular region preparation module for preparing first simulation regions, each of which takes the calculated center point as the center thereof, and preparing a plurality of first rectangular regions in a region where the first simulation regions overlap with each other; (e) a second calculated center point calculation module for acquiring second rectangular regions by extracting the first rectangular regions where two or more of the first simulation regions overlap with each other, and calculating second calculated center points based on the second rectangular regions; (f) a second simulation region preparation module for acquiring second simulation regions based on the second calculated center points; (g) a process simulation execution module for calculating a correction value at each correction value calculating point by using a process simulation in each of the second simulation regions; and (h) a correction pattern preparation module for preparing the correction pattern by performing pattern data processing with respect to each edge thereof by use of the correction value.

According to a second aspect of the present invention, a method for generating a mask data comprises the steps of: (a) extracting a line segment to be corrected from a design pattern and dividing the extracted line segment to be corrected into a length suitable for correction; (b) calculating correction value calculating points from each divided edge; (c) setting first calculated center points based on the correction value calculating points and a shape of a pattern to be corrected; (d) preparing first simulation regions, each of which takes the calculated center point as the center thereof, and preparing a plurality of first rectangular regions composed of rectangular regions in a region where the first simulation regions overlap with each other; (e) acquiring second rectangular regions by extracting the first rectangular regions where two or more of the first simulation regions overlap with each other from the first rectangular regions, and calculating second calculated center points based on the second rectangular regions; (f) acquiring second simulation regions based on the second calculated center points; (g) calculating a correction value at each correction value calculating point by using a process simulation in each of the second simulation regions; and (h) preparing the correction pattern by performing pattern data processing with respect to each edge thereof by use of the correction value.

According to a third aspect of the present invention, a computer-readable storage medium having a computer-program recorded thereon, the computer-program causing a CPU of the mask data generating apparatus to execute procedures for: (a) extracting a line segment to be corrected from a design pattern and dividing the extracted line segment to be corrected into a length suitable for correction; (b) calculating correction value calculating points from each divided edge; (c) setting first calculated center points based on the correction value calculating points and a shape of a pattern to be corrected; (d) preparing first simulation regions, each of which takes the calculated center point as the center thereof, and preparing a plurality of first rectangular regions composed of rectangular regions in a region where the first simulation regions overlap with each other; (e) acquiring second rectangular regions by extracting the first rectangular regions where two or more of the first simulation regions overlap with each other from the first rectangular regions, and calculating second calculated center points based on the second rectangular regions; (f) acquiring second simulation regions based on the second calculated center points; (g) calculating a correction value at each correction value calculating point by using a process simulation in each of the second simulation regions; and (h) preparing the correction pattern by performing pattern data processing with respect to each edge thereof by use of the correction value.

BRIEF DESCRIPTION OF THE DRAWINGS

FIG. 9 is a table showing a result of an example according to the first embodiment.

DETAILED DESCRIPTION OF THE INVENTION

Figure 1:
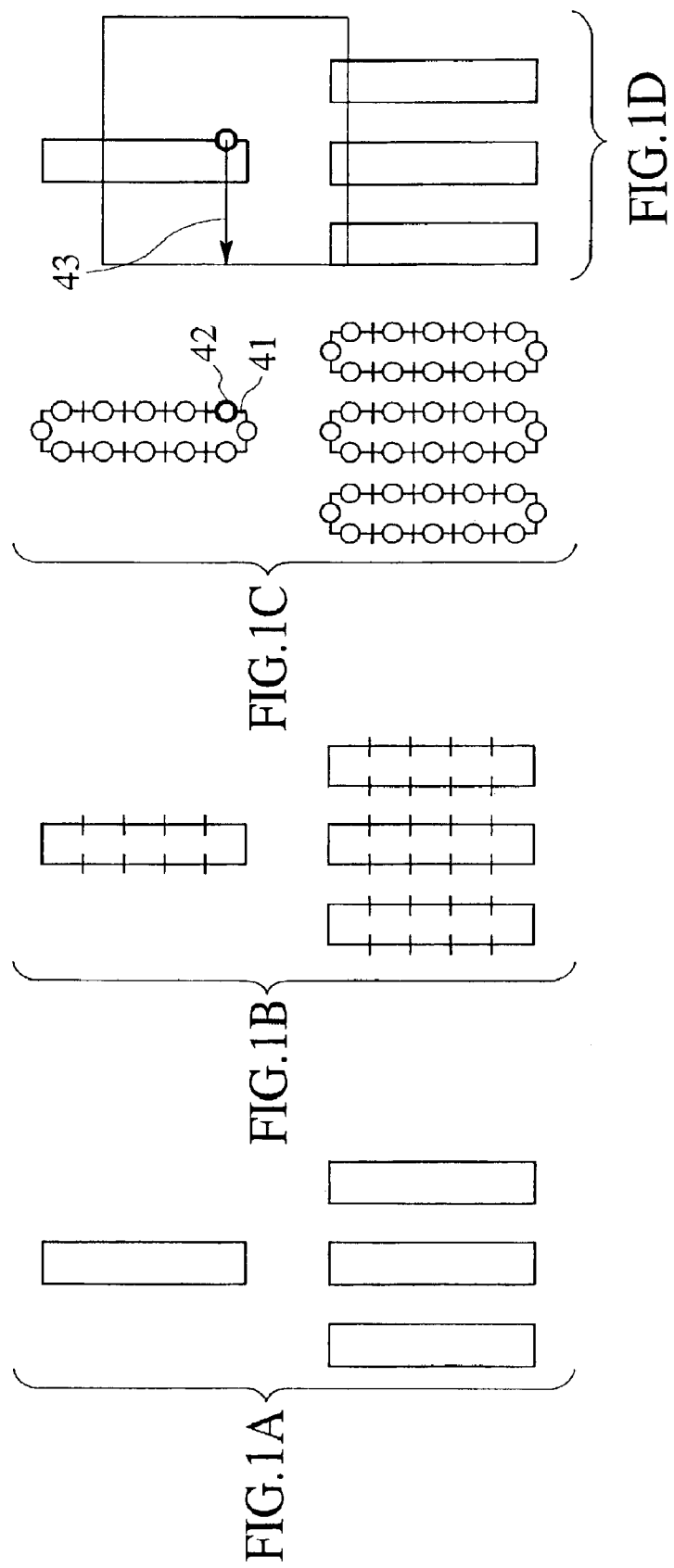
FIG. 1A is a view showing patterns to be corrected, which are used in optical proximity effect correction conventionally performed.
FIG. 1B is a view showing the patterns to be corrected, which are used in optical proximity effect correction conventionally performed.
FIG. 1C is a view showing the patterns to be corrected, which are used in optical proximity effect correction conventionally performed.
FIG. 1D is a view showing the patterns to be corrected, which are used in optical proximity effect correction conventionally performed.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is conventional in the representation of mask data generating apparatus, it will be appreciated that the various drawings are not drawn to scale from one figure to another nor inside a given figure, and in particular that the wiring widths are arbitrarily drawn to facilitate the reading of the drawings.

In the following descriptions, numerous specific details are set fourth such as specific signal values, etc. to provide a throughout understanding of the present invention. However, it will be obvious to those skilled in the art that the present invention may be practiced without such specific details.

First Embodiment
(Mask Data Generating Apparatus)

Figure 2:
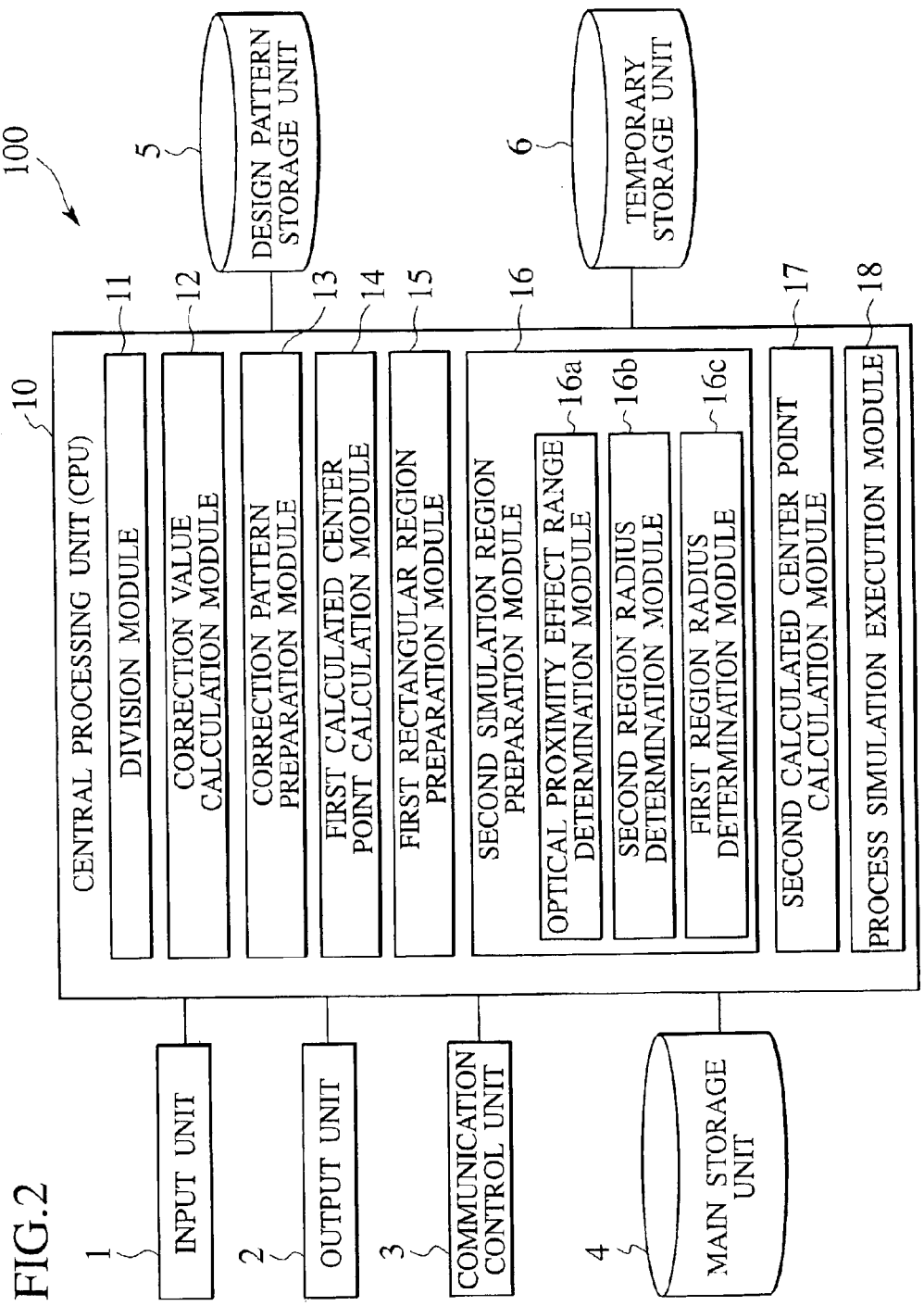
FIG. 2 is a view showing a configuration of a mask data generating apparatus according to a first embodiment.

By referring to FIG. 2, description will be made for a mask data generating apparatus 100 according to a first embodiment of the present invention. The mask data generating apparatus 100 performs a process simulation for generating a mask data. As shown in FIG. 2, in the mask data generating apparatus 100 according to the first embodiment, a central processing unit (CPU) 10 performs management of the entire mask data generating apparatus 100 and executes a control program stored in a main storage unit 4, thus realizing respective functions. Moreover, the CPU 10 is connected with an input unit 1, an output unit 2, a communication control unit 3, the main storage unit 4, a design pattern storage unit 5 and a temporary storage unit 6, and controls the respective units.

In the CPU 10, provided are: a division module 11; a correction value calculation module 12; a correction pattern preparation module 13; a first calculated center point calculation module 14; a first rectangular region preparation module 15; a second simulation region preparation module 16; a second calculated center point calculation module 17; and a process simulation execution module 18. Moreover, the second simulation region preparation module 16 is constituted by an optical proximity effect range determination module 16a, a second region radius determination module 16b and a first region radius determination module 16c.

Figure 3:
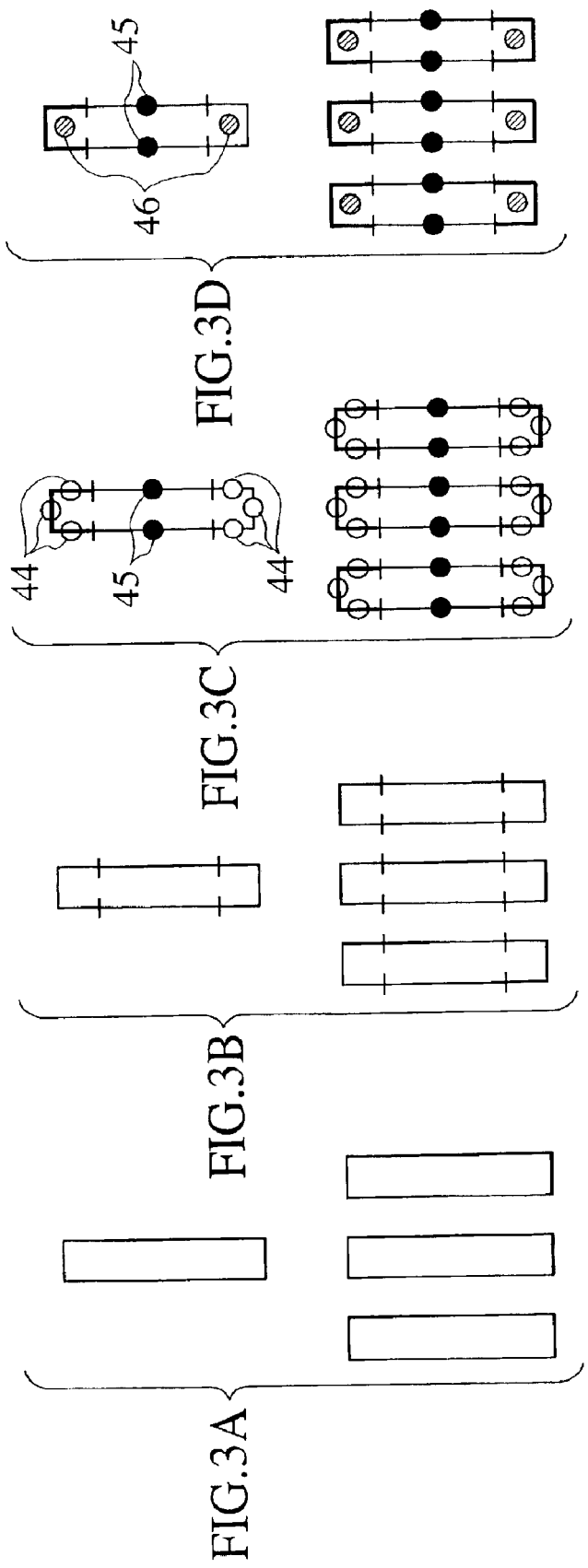
FIG. 3A is a view showing patterns to be corrected, which are used in optical proximity effect correction according to the first embodiment.
FIG. 3B is a view showing the patterns to be corrected, which are used in optical proximity effect correction according to the first embodiment.
FIG. 3C is a view showing the patterns to be corrected, which are used in optical proximity effect correction according to the first embodiment.
FIG. 3D is a view showing the patterns to be corrected, which are used in optical proximity effect correction according to the first embodiment.

The division module 11 extracts a line segment to be corrected from a design pattern, and divides the extracted line segment into a length suitable for correction in consideration of a shape of a pattern to be corrected, as shown in FIG. 3B. The correction value calculation module 12 calculates the positions of a one-dimensional correction value calculating point 45 and a two-dimensional correction value calculating point 44 in each divided edge. The correction pattern preparation module 13 performs a process simulation to be described later and prepares a correction pattern so as to move each edge based on the correction value calculated for each edge. Thereafter, a transfer position of the correction pattern in transferring the pattern onto a mask is calculated by simulation, and a difference between the correction pattern and its transfer position at each correction value calculating point is acquired and then outputted as error information. Then, evaluation and verification are made for a transfer shape of the correction pattern, based on this error information and the like. The first calculated center point calculation module 14 calculates calculated center points 46 based on the correction value calculating point and the shape of the pattern to be corrected.

The first rectangular region preparation module 15 prepares first simulation regions 15a, 15b, 15c, 15d (see FIGS. 5A to 5D), each of which takes the calculated center point as the center thereof, and prepares a plurality of first rectangular regions 15a, 15b, 15c, 15d as shown in FIGS. 6A to 6C and 7A to 7C, in a region where the first simulation regions overlap with each other. A degree of "overlap" in the region where the first simulation regions 15a,15b,15c,15d overlap with each other differs depending on respective design patterns. However, it is assumed that the numbers of the overlaps of the plurality of rectangular regions acquired by sectioning the first simulation regions overlapping with each other are counted, and processing is sequentially performed from the rectangular region with the largest number when these numbers of the overlaps are arranged in descending order. Regarding also rectangular regions including the plurality of first calculated center points, it is assumed that the processing is performed by prioritizing a rectangular region with the largest number of the first calculated center points. The first rectangular region may have another shape in accordance with spots where the first calculated center points exist. The second calculated center point calculation module 17 calculates second calculated center points based on second rectangular regions. When the second rectangular region does not have a shape of the rectangular, the region can take a boundary box of the shape. The second simulation region preparation module 16 prepares second simulation regions based on the second calculated center points. The process simulation execution module 18 calculates a correction value at each correction value calculating point, by using the process simulation in each of the second simulation regions.

Figure 7:
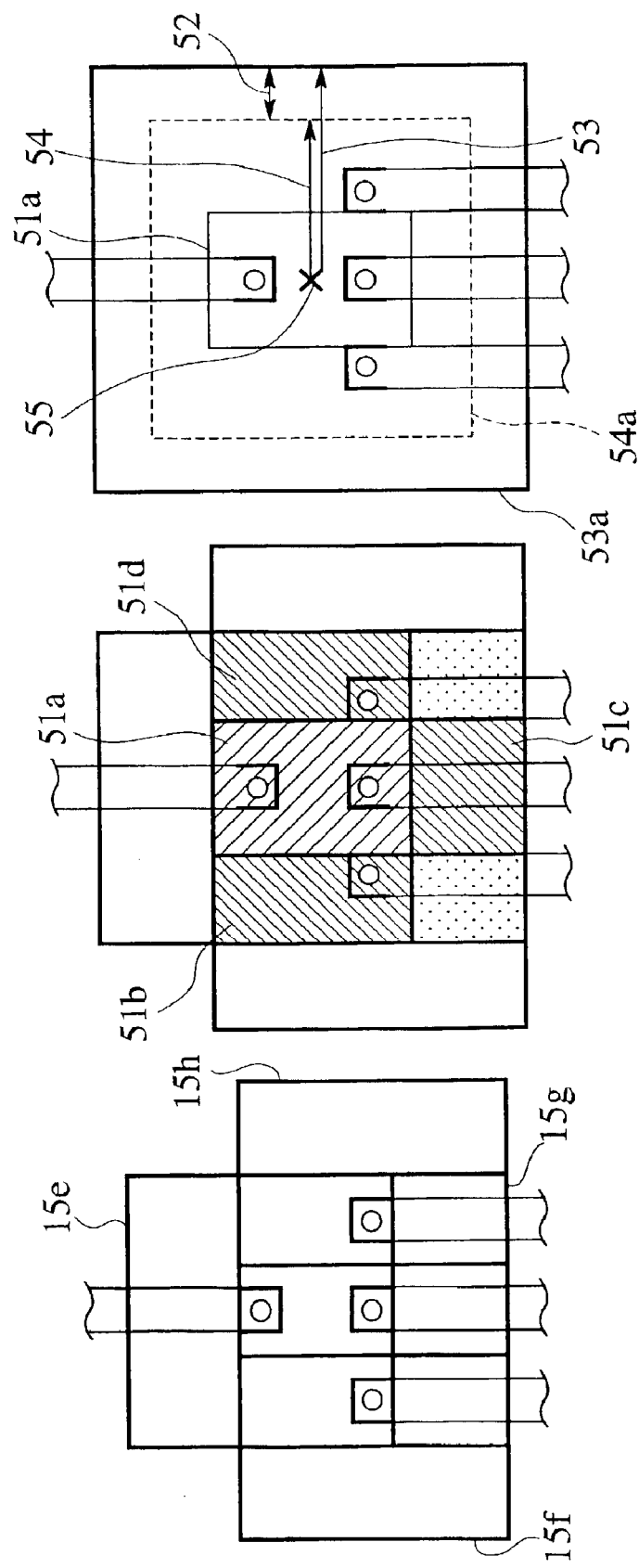
FIG. 7A is a view showing a plurality of rectangular regions according to a modified embodiment of the first embodiment.
FIG. 7B is a view showing a plurality of rectangular regions according to the modified embodiment of the first embodiment.
FIG. 7C is a view showing a plurality of rectangular regions according to the modified embodiment of the first embodiment.

Moreover, the optical proximity effect range determination module 16a determines a range of the optical proximity effect (hereinafter referred to as a "margin"). Specifically, the range is determined based on a wavelength of light, an exposure condition, a development condition of resist and the like. As shown in FIG. 7C, this margin 52 has a resultant value acquired by subtracting a first region radius 54 from a second region radius 53. That is, the second region radius 53 is a radius determining a range for performing the process simulation, and for this radius, the range of the optical proximity effect needs to be considered. The region where the calculation can be actually performed by the process simulation and where the first calculated center points exist, the region being corrected in consideration of the range of the optical proximity effect, is a region determined by the first region radius. In other words, a region determined by the second region radius is a region for actually performing the process simulation, and the region determined by the first region radius is a region where an effect of the process simulation actually performed emerges.

The first region 54a is defined in terms of a radius of a circle inscribed in the first region 54a. The second region 53a is also a square, and "the second region radius 53" is defined in terms of a radius of a circle inscribed in the second region 53a. However, when a process with different directionalities for vertical and horizontal directions (anisotropy) is used, a wide range of applications such as making the first and second regions 54a and 53a rectangular is also possible. The second region radius determination module 16b determines the second region radius 53 (see FIG. 7C) for preparing the second simulation region 53a where the process simulation is performed, in accordance with the capacity of an arithmetic unit and the scale of the design pattern. Specifically, the second region radius 53 is assumed to be about 1 to 3 μm. The second region radius 53 is determined based on conditions of the design, the process and the like. The first region radius determination module 16c determines the first region radius 54 (see FIG. 7C) for preparing the first region 54a including two or more of the first calculated center points, based on the margin 52 and the second simulation region 53a. Specifically, the first region radius 54 is assumed to be about 0.5 μm.

The input unit 1 is implemented by a keyboard, a mouse and the like, and may perform input by use of an external device via the communication control unit 3. The external device herein means a storage medium such as a compact disk readable and writable (CD-RW), a magneto optical (MO), a ZIP disk and a digital versatile disk (DVD) and its driving device. The output unit 2 has a display sub-unit (not shown) and a print sub-unit (not shown), and is specifically implemented by a display device such as a liquid crystal display and a CRT display, a printer such as an ink-jet printer and a laser printer, and the like. The communication control unit 3 generates a control signal for transmitting/receiving data through communication lines to/from an exposure device for preparing a mask (not shown), other general purpose machines and the like. A read only memory (ROM) and a random access memory (RAM) are built into the main storage unit 4. The ROM functions as a program memory and the like storing a program executed in the CPU 10; the RAM stores data and the like which are utilized during program execution processing in the CPU 10. The design pattern storage unit 5 stores data of patterns for a mask design. The temporary storage unit 6 functions as a buffer, a data memory and the like utilized as an operation region, a data memory.

(Method for Generating a Mask Data)

Figure 8:
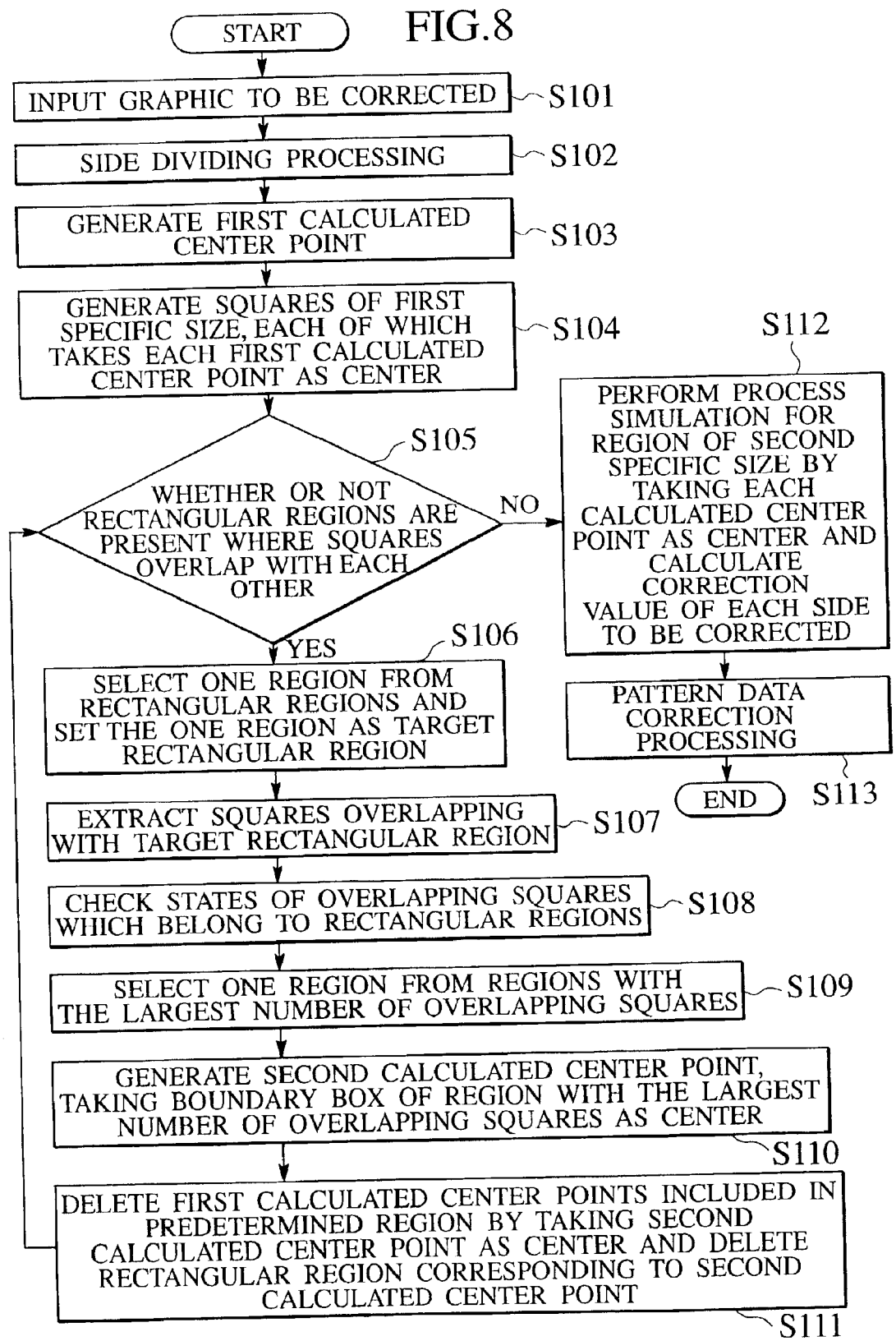
FIG. 8 is a flowchart illustrating a method for generating a mask data, according to the first embodiment.

Hereinafter, a method for generating a mask data by use of the mask data generating apparatus 100 will be described with reference to the flowchart of FIG. 8.

(a) First, in Step S101, a pattern to be corrected in the optical proximity effect correction (FIG. 3A) is selected from the design pattern storage unit 5.

(b) In Step S102, the division module 11 divides each edge of the pattern to be corrected in the vicinity of its line ends as illustrated by short horizontal lines in FIG. 3B.

(c) In Step S103, as shown in FIG. 3C, by taking the edges in the vicinity of the line ends as objects of the two-dimensional correction, the correction value calculation module 12 calculates a plurality of two-dimensional correction value calculating points 44 illustrated by open circles. Moreover, by taking the edges other than those in the vicinity of the line ends as objects of the one-dimensional correction, the correction value calculation module 12 calculates a plurality of one-dimensional correction value calculating points 45, illustrated by filled circles. Regarding the edges that are to be two-dimensionally corrected, the first calculated center point calculation module 14 calculates the calculated center point 46 for each of the line ends. The calculated center points 46 are illustrated by hatched circles in FIG. 3D.

Figure 4:
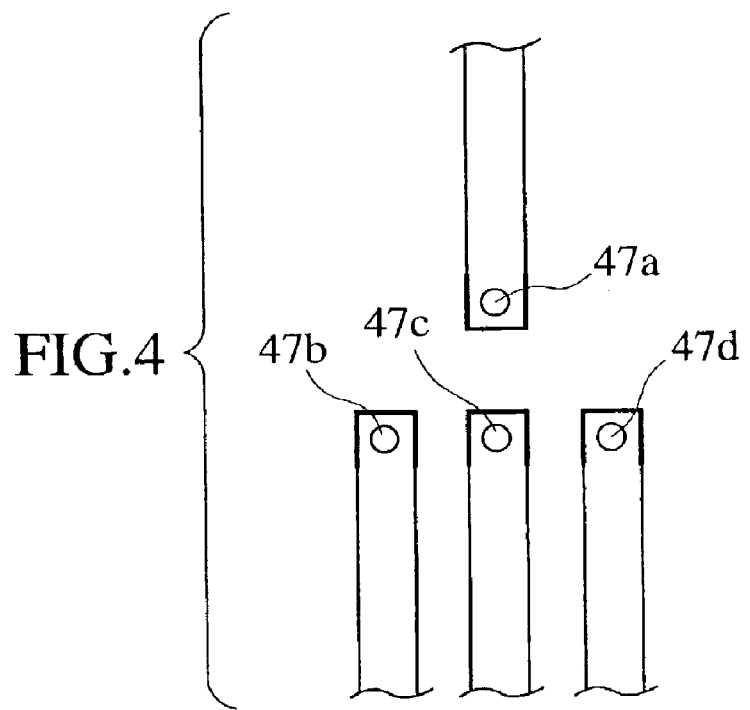
FIG. 4 is a view of an object to be corrected, which is used in a simulation for calculating a rectangular region, according to the first embodiment.
Figure 5:
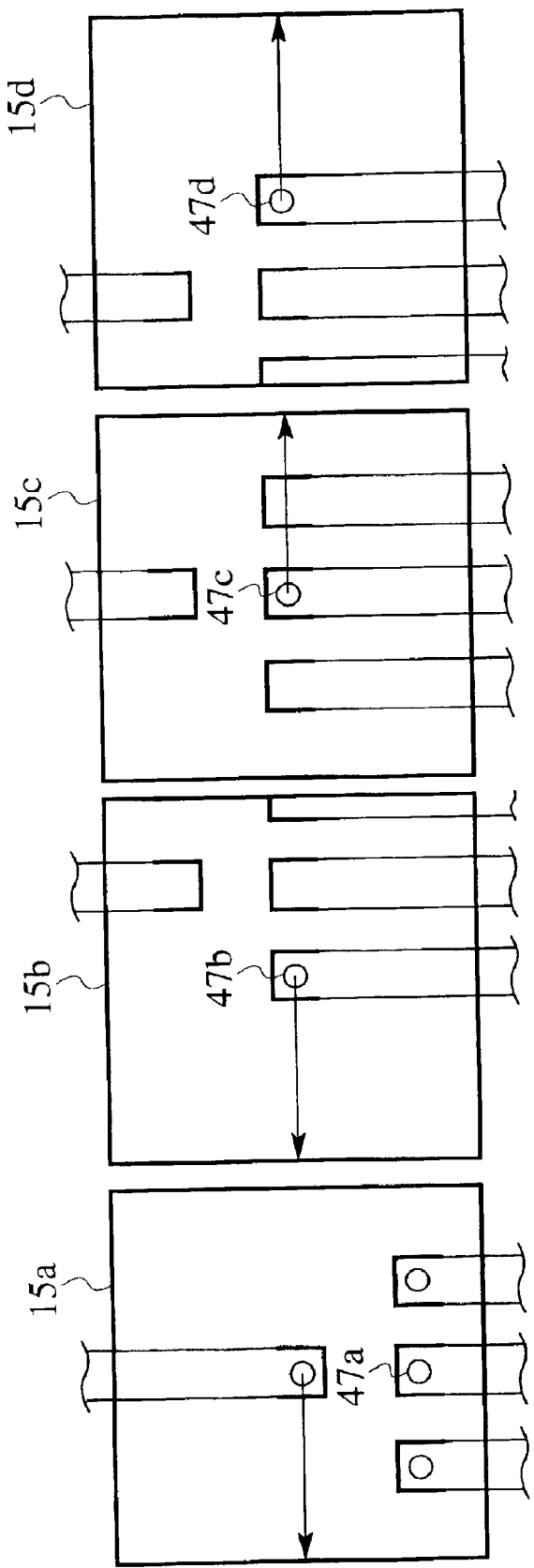
FIG. 5A is a view showing a simulation region in which a calculated center point is set as the center, according to the first embodiment.
FIG. 5B is a view showing the simulation region in which a calculated center point is set as the center, according to the first embodiment.
FIG. 5C is a view showing the simulation region in which a calculated center point is set as the center, according to the first embodiment.
FIG. 5D is a view showing the simulation region in which a calculated center point is set as the center, according to the first embodiment.
Figure 6:
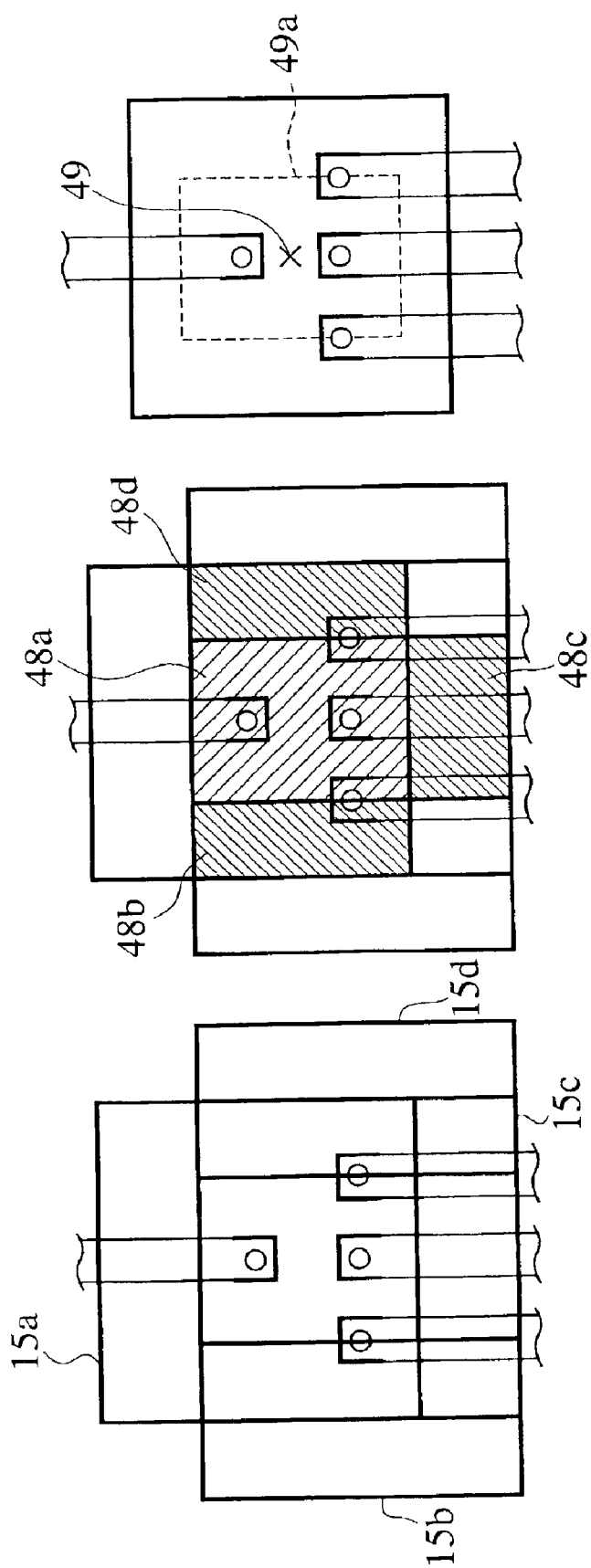
FIG. 6A is a view showing a plurality of rectangular regions according to the first embodiment.
FIG. 6B is a view showing a plurality of rectangular regions according to the first embodiment.
FIG. 6C is a view showing a plurality of rectangular regions according to the first embodiment.

(d) Next, description will be made for a simulation for calculating rectangular regions where the first rectangular region preparation module 15 performs correction based on the calculated center points 46 in step S 104. For example, in FIG. 4, when the edges corresponding to the line ends are taken as objects of the correction, the calculated center points 46 are assumed to be 47a, 47b, 47c and 47d. In this event, the correction value calculation module 12 performs a process simulation with respect to regions of a predetermined size where a simulation is performed. The regions—the simulation regions—include the calculated center points 47a to 47d as the centers respectively, and the edges around the centers are supposed to be influenced by the optical proximity effect. Thus, correction value calculating points of the edges to be corrected are calculated. More concretely, the simulation region 15a which is a square region inscribing a circle with a radius indicated by an arrow taking the calculated center point 47a as the center thereof is prepared as shown in FIG. 5A. The simulation region 15b which is a square region inscribing a circle with a radius indicated by an arrow taking the calculated center point 47b as the center thereof is prepared as shown in FIG. 5B. The simulation region 15c which is a square region in which a circle of a radius indicated by an arrow taking the calculated center point 47c as the center thereof is prepared as shown in FIG. 5C. The simulation region 15d which is a square region in which a circle of a radius indicated by an arrow taking the calculated center point 47d as the center thereof is prepared as shown in FIG. 5D. The plurality of squares defining the above-described plurality of simulation regions are overlapped with each other as shown in FIG. 6A. As a result, the plurality of first rectangular regions as shown in FIG. 6A are prepared.

(e) In Step S105, confirmation is made of the existence of the first rectangular regions which are the portions where the square simulation regions partially overlap with each other. Then, in Step S106, one region is selected from the plurality of first rectangular regions, and the region is set to be a target rectangular region. In Step S107, a degree of the overlap between the target rectangular region and each of the other square simulation regions is checked. Specifically, the number of the other squares overlapping the target rectangular region is counted. For example, nine rectangulars are found in FIG. 6A as the first rectangular regions. Moreover, when the first rectangular regions have a non-rectangular shape such as an L shape, the number of the overlaps is counted as they are non-rectangular. This operation is repeated for each of the first rectangular regions.

(f) Next, in Step S108, the first rectangular regions are arranged in descending order from the one having the largest number of squares overlapping therein. In FIG. 6B, when the first rectangular regions are arranged from the one with the largest number of the overlapping squares, the rectangular region 48a has the maximum four squares, the rectangular regions 48b, 48c and 48d have three squares, respectively, and the other rectangular regions have one to two squares, respectively.

(g) Next, in Step S109, the second calculated center point calculation module 17 selects the first rectangular region 48a with the largest number of the overlapping squares. Then, in Step S110, the first rectangular region 48a is set as the second rectangular region 49a, and the second calculated center point 49 is acquired based on the second rectangular region 49a. The correction values of the respective edges thereof are calculated by performing the simulation with respect to the vicinity of the second calculated center point 49. In Step S111, the first calculated center points and the correction value calculating points in the second rectangular region 49a corresponding to the second calculated center point 49 are deleted. After the above process is finished, the processing returns to Step S105. Note that, in FIG. 6C, as the first calculated center points in the second rectangular region 49a, the ones on the dotted line are counted. However, an operator and the like can determine whether or not the first calculated center points on the dotted line are included.

Figure 17A:
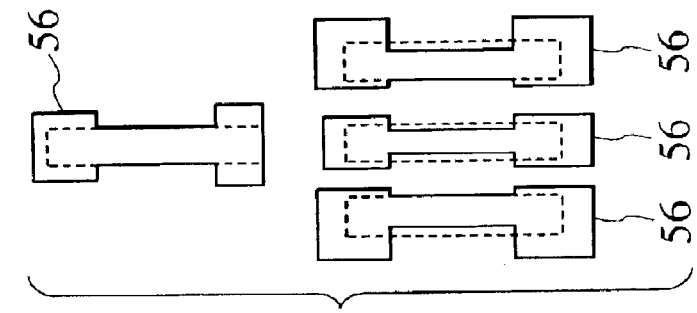
FIG. 17A is a view showing correction patterns according to the first embodiment.
Figure 17B:
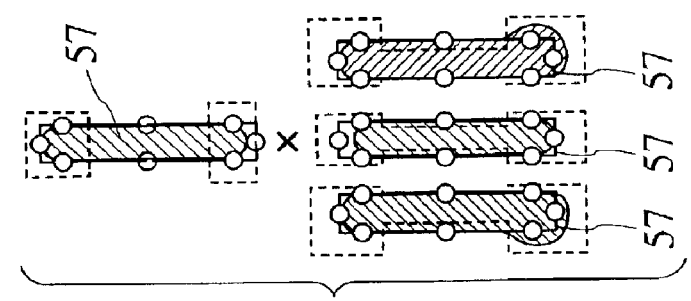
FIG. 17B is a view showing the correction patterns according to the first embodiment.
Figure 17C:
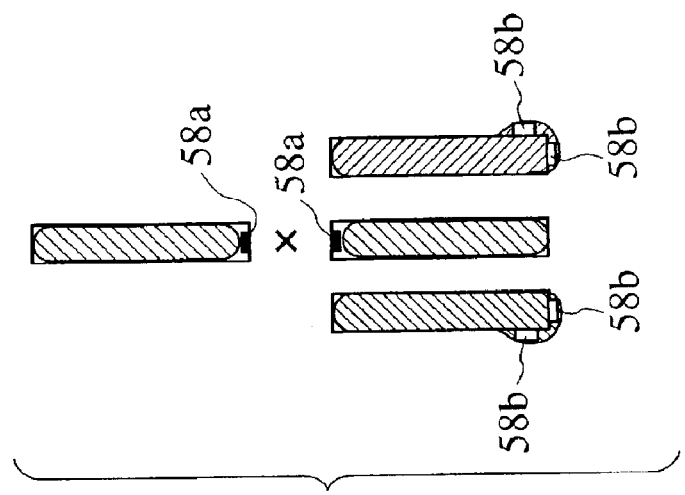
FIG. 17C is a view showing the correction patterns according to the first embodiment.

(h) After finishing all the processing for the first rectangular regions with the squares overlapping therewith, in Step S112, the process simulation execution module 18 performs the process simulation for the second rectangular region 49a taking the second calculated center point 49 as the center and calculates the correction values of the edges of each correction pattern. In Step S113, the correction pattern preparation module 13 performs processing so as to move the respective edges by applying the calculated correction values to the respective edges of the correction pattern, thus preparing the correction patterns 56 shown in FIG. 17A. Transfer positions of these correction patterns 56 in transferring the pattern on a mask are calculated as simulation images 57 for each correction value calculation point in FIG. 17B, and differences between the correction patterns 56 and their simulation images 57 are acquired. The differences are outputted as error information 58 shown in FIG. 17C. Based on the amount of this error information 58, the amount of the correction patterns 56 to be prepared and the like, transfer shapes of the correction patterns are evaluated and verified. After finishing all the foregoing processing, the operation for generating a mask data is completed.

According to the above method, the correction values, which were calculated by performing the process simulation four times in the conventional example, can be calculated by a single process simulation, thus resulting in the shortening of the process simulation time. When two or more of the first rectangular regions overlapping with a basic square among the second rectangular region 49a generated, one of the first rectangular regions having a largest number of overlapping levels with the basic square would be chosen at random. Moreover, the second calculated center point may be acquired by grouping the correction value calculating points disposed on the respective divided edges, without grouping the calculated center points 47a to 47d. Furthermore, the first calculated center points can be replaced by the second calculated center point. However, the first calculated center points can also be left as they are without being replaced by the first calculated center points corresponding to the respective edges to be corrected or by the calculated center points generating the correction value calculating points, and a processing of investigating the overlaps thereof with the other calculated center points may be performed for the first calculation point.

(Modified Method for Generating a Mask Data)

For the technique of preparing the square simulation regions taking the first calculated center points 47a to 47d as the center, respectively in step S104, and of generating the rectangular regions by overlapping the plurality of square simulation regions with each other, a technique described below can be also used.

(a) First, the respective simulation regions are prepared as the squares, each of which inscribes the circle with the radius indicated by the arrow, based on the respective first calculated center points 47a to 47d. Then, the first rectangular region preparation module 15 overlaps these square simulation regions with each other, and prepares the plurality of first rectangular regions 15e, 15f, 15g, 15h as shown in FIG. 7A.

(b) Next, the first rectangular region preparation module 15 selects one region from the first rectangular regions and sets the one region as the target rectangular region, and checks the degree of the overlap between the target rectangular region and each of the other square simulation regions. In other words, the number of the other squares overlapping with the target rectangular region is counted. This operation is repeated for each of the first rectangular regions.

(c) The first rectangular regions are arranged in descending order from the one with the largest number of the overlaps with the squares. In FIG. 7B, when the first rectangular regions are arranged from the one with the largest number of overlapping squares, the rectangular region 51a hatched with the lines slanting down to the left has the maximum four squares, the rectangular regions 51b, 51c and 51d hatched with the lines slanting down to the right have three squares, respectively, the rectangular regions filled with fine dots have two squares, respectively, and the other rectangular regions have one square, respectively.

(d) Next, the second calculated center point calculation module 17 selects the first rectangular region 51a having the largest number of the overlapping squares, and sets the first rectangular region 51a as the second rectangular region (boundary box), thus acquiring the second calculated center point 55 based on this second rectangular region 51a as shown in FIG. 7C. The optical proximity effect range determination module 16a determines the range of the optical proximity effect based on the exposure condition and the development condition of resist, and sets the range as being the margin 52. The second region radius determination module 16b determines the second region radius 53 for performing the process simulation in accordance with the capability of the arithmetic unit and the scale of the design pattern as well as the second region (the second simulation region) 53a inscribing the circle with the second region radius 53. Furthermore, by subtracting the margin 52 from the second region radius 53, the first region radius 54 and the first region 54a inscribing the circle with the first region radius 54 are determined. Moreover, it is assumed that the first region 54a has at least two or more of the first calculated center points. Incidentally, in FIG. 7C, the first region 54a has four of the first calculated center points.

(e) Next, the first calculated center points included in the second simulation region 53a are deleted. Thereafter, calculation is performed for the second simulation region 53a, and the correction values of the respective edges to be corrected are calculated. Here, it is assumed that the second region radius 53 is larger than the first region radius 54 and has a size large enough to calculate the correction values of the respective edges to be corrected.

By use of the above technique, the correction values, which were calculated by performing four times of the process simulation in the conventional example, can be calculated by a single process simulation. Moreover, the region large enough to calculate the correction values of the respective edges to be corrected, which are grouped, can be secured. Note that, similarly to the first embodiment, regarding the region newly generating the calculated center points, when there are a plurality of rectangular regions with the largest number of the overlapping squares, one region there among may be selected at random.

EXAMPLE

Figure 10:
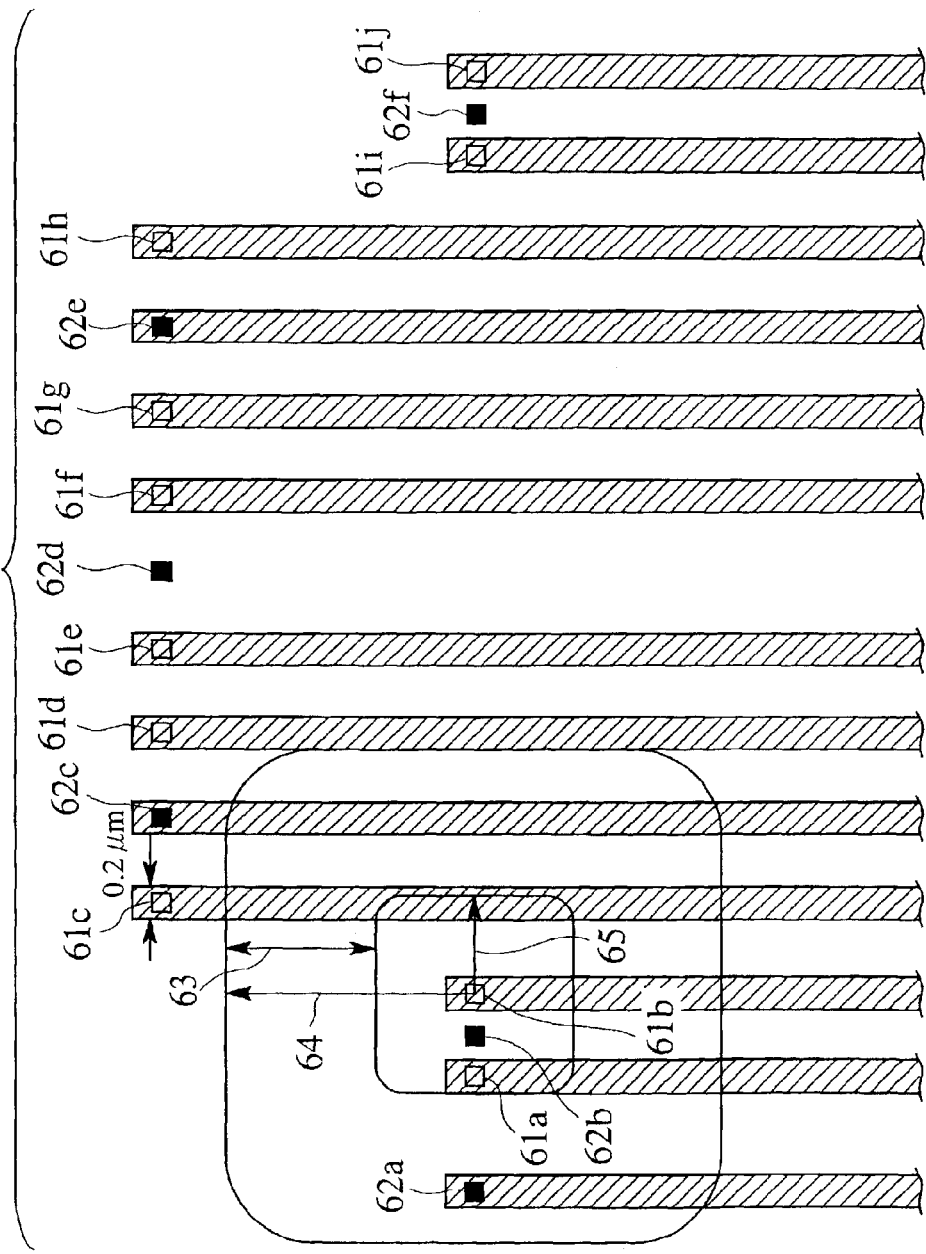
FIG. 10 is a view showing correction patterns used in the example according to the first embodiment.
Figure 11:
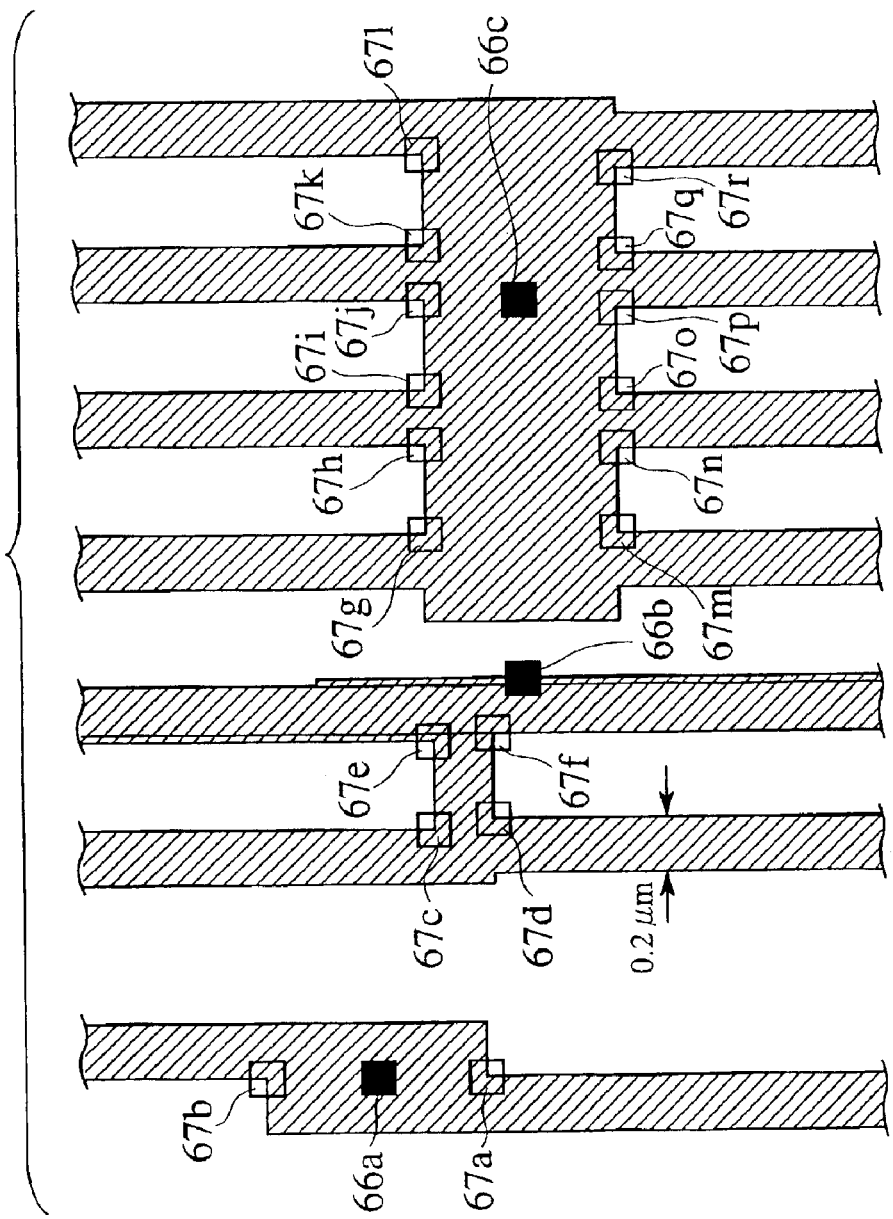
FIG. 11 is a view showing correction patterns used in the example according to the first embodiment.

Description will be made for an example in which the mask data generating apparatus and method for generating a mask data according to the first embodiment are applied to a semiconductor circuit layout. As shown in FIG. 10, first calculated center points 61a to 61j are provided for respective correction patterns. As a result of the grouping by use of the method for generating a mask data according to the first embodiment, second calculated center points 62a to 61j are calculated. Note that the width of each of the correction patterns was set to 0.2 μmm, a first region radius 65 was set to 0.6 μm, a second region radius 64 was set to 1.5 μm, and a margin 63 was set to 0.9 μm. Here, it was possible to reduce the number of the second calculated center points to six while the number of the first calculated center points was 13. Moreover, in FIG. 11, first calculated center points 67a to 67r are provided. As a result of grouping by use of the method for generating a mask data according to the first embodiment, second calculated center points 66a to 66j are calculated. In this event, it was made possible to reduce the number of the second calculated center points to three, when the number of the first calculated center points was 18.

FIG. 9 shows a result of performing the OPC by setting calculated center points for a region of 41 μm×57 μm, which was extracted from one layer of a semiconductor device. The number of calculated center points was 3133 in the conventional example, meanwhile, the number thereof was reduced by 82% in the example using the first embodiment, thus obtaining 552. Pattern matching was performed for the simulation regions taking these calculated center points as the center, respectively, in order to put together regions of the same arrangement. As a result, the number of the calculated center points after pattern matching was 2149 in the conventional example, meanwhile, the number thereof was 491, which is reduced by 77%, in the example. Furthermore, the simulation was performed for the regions taking the calculated center points as the center thereof, respectively, and the correction values thereof were acquired to perform the correction thereof. As a result, the time required in the conventional example was 21,392 seconds, meanwhile, it was made possible to perform the processing in 3,233 seconds, a reduction of 85%, in the example.

As described above, it was confirmed that the time required for the process simulation can be shortened by performing process simulation using the second calculated center points acquired by performing group processing for the first calculated center points as the calculated center points.

Second Embodiment

In a second embodiment of the present invention, description will be made for a method of generating a mask data and a mask data generating apparatus in which a function is further provided to the mask data generating apparatus and method for generating a mask data described in the first embodiment, the function performing batch processing to a correction pattern having an array arrangement configuration for use in an ASIC, a memory device and the like.

(Mask Data Generating Apparatus)

Figure 12:
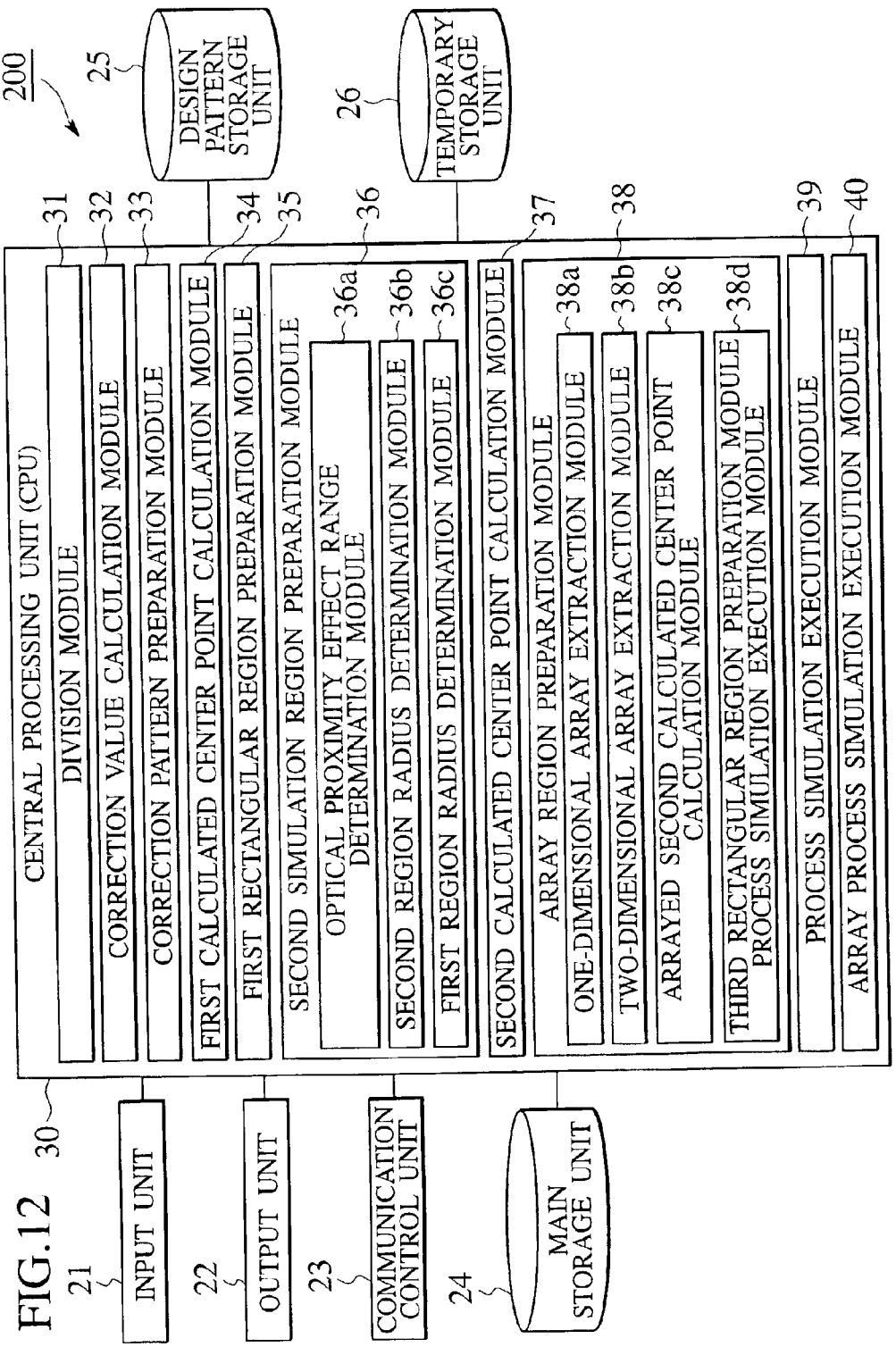
FIG. 12 is a view showing a configuration of a mask data generating apparatus according to a second embodiment.

In a mask data generating apparatus 200 according to the second embodiment of the present invention, as shown in FIG. 12, a central processing unit (CPU) 30 performs management of the entire mask data generating apparatus 200 and executes a control program stored in a main storage unit 24, thus realizing respective functions. The CPU 30 is connected with an input unit 21, an output unit 22, a communication control unit 23, the main storage unit 24, a design pattern storage unit 25 and a temporary storage unit 26, and controls the respective units. In the CPU 30, provided are: a division module 31; a correction value calculation module 32; a correction pattern preparation module 33; a first calculated center point calculation module 34; a third rectangular region preparation module 35; a second simulation region preparation module 36; a second calculated center point calculation module 37; a second array region preparation module 38; and a process simulation execution module 39. Moreover, the second simulation region preparation module 36 is constituted by: an optical proximity effect range determination module 36a; a second region radius determination module 36b; and a third region radius determination module 36c. Furthermore, the second array region preparation module 38 includes: a one-dimensional array extraction module 38a; a two-dimensional array extraction module 38b; an arrayed second calculated center point calculation module 38c; a third rectangular region preparation module 38d; the process simulation execution module 39; and an array process simulation execution module 40.

Figure 14B:
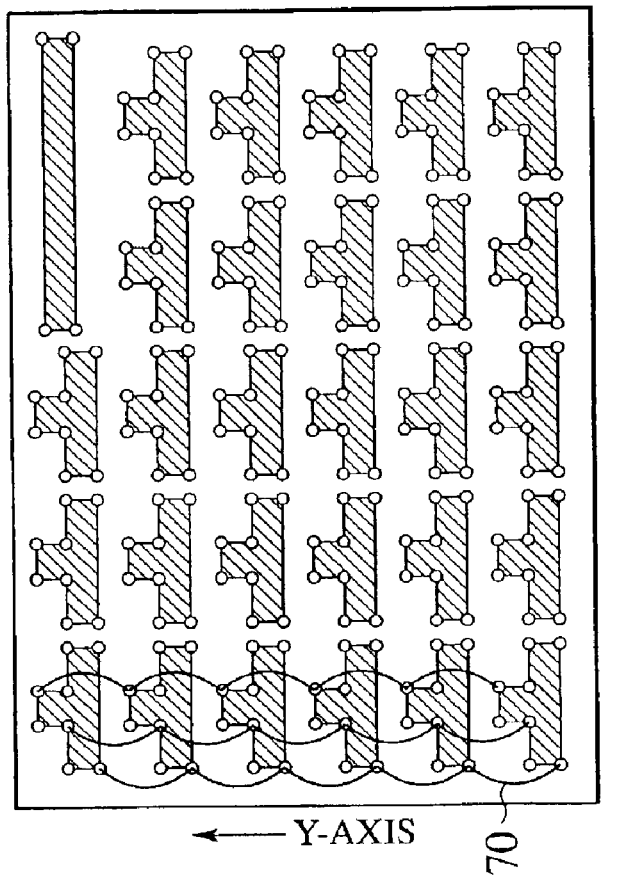
FIG. 14B is a view showing the correction patterns of the array arrangement configuration used in the second embodiment.

Note that, for units and modules other than the one-dimensional array extraction module 38a, the two-dimensional array extraction module 38b, the arrayed second calculated center point calculation module 38c, the third rectangular region preparation module 38d and the array process simulation execution module 40, the modules similar to those explained in the first embodiment will be used. Thus, description thereof will be omitted. The one-dimensional array extraction module 38a investigates a periodicity 69 of the patterns to be corrected in the one-dimensional direction (see FIG. 14A), and extracts the patterns to be corrected, which are arranged with the periodicity, as one of one-dimensional arrays. The two-dimensional array extraction module 38b investigates a periodicity 70 of patterns to be corrected in the two-dimensional direction (see FIG. 14B), and extracts the patterns to be corrected, which are arranged with the periodicity in a two-dimensional array. The third rectangular region preparation module 38d constitutes an array region by use of the one-dimensional and two-dimensional arrays, divides the array region in consideration of array pitch, a first simulation region and a second simulation region, and thus prepares a plurality of third rectangular regions (boundary boxes) 71 as shown in FIG. 15A. The arrayed second calculated center point calculation module 38c calculates a third calculated center point 73 based on the third rectangular regions 71 (FIG. 15B). In a plurality of third simulation regions, each of which takes an array second calculated center point as its center, the array process simulation execution module 40 calculates correction values of respective correction value calculating points by using a process simulation. Note that the process simulation execution module 39 and the array process simulation execution module 40 can be implemented by programs having the same instructions.

(Method for Generating a Mask Data)

Figure 16A:
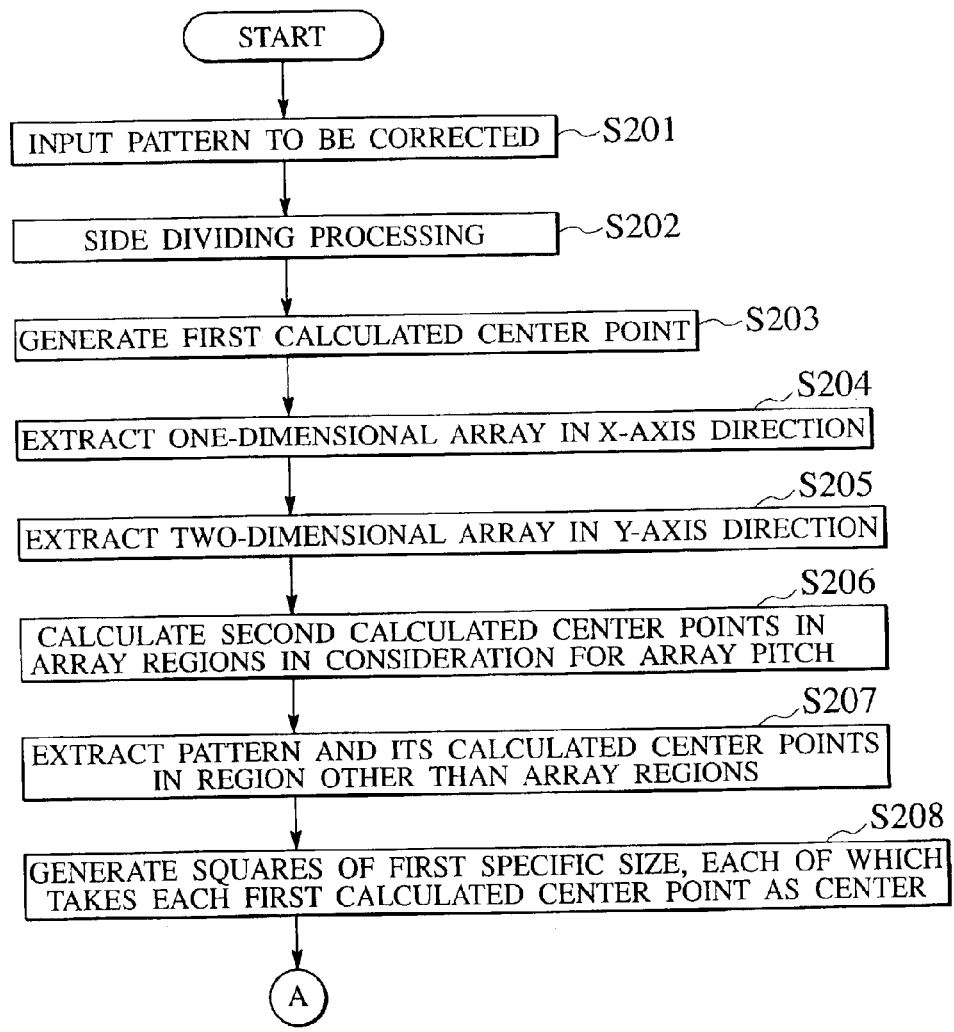
FIG. 16A is a flowchart illustrating a method for generating a mask data, according to the second embodiment.
Figure 16B:
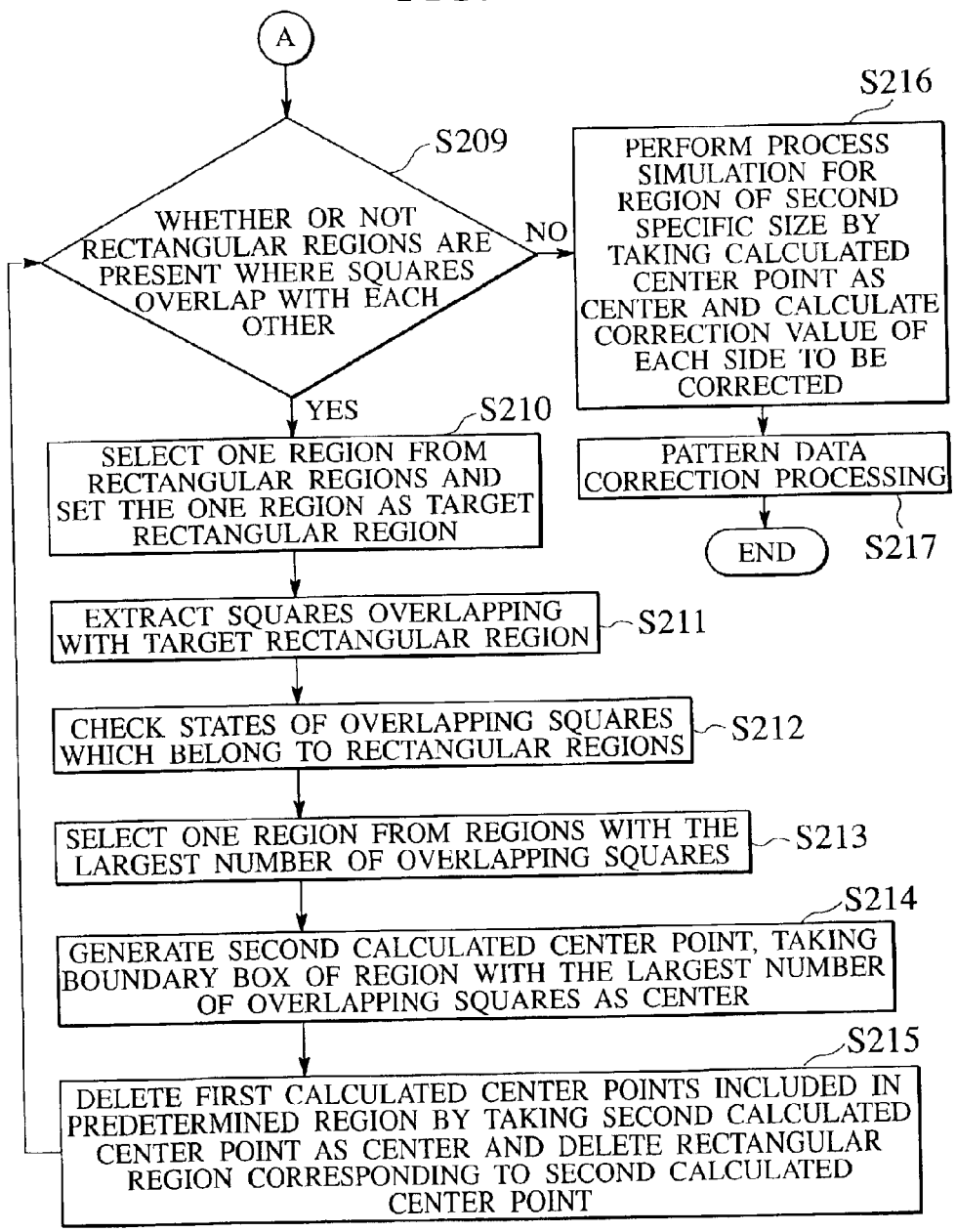
FIG. 16B is a flowchart illustrating a method for generating a mask data, according to the second embodiment.

Next, by use of a flowchart of FIG. 16, description will be made for the method for generating a mask data according to the second embodiment.

(a) First, in Step S201, patterns to be corrected in the optical proximity effect correction are selected from the design pattern storage unit 25.

Figure 13B:
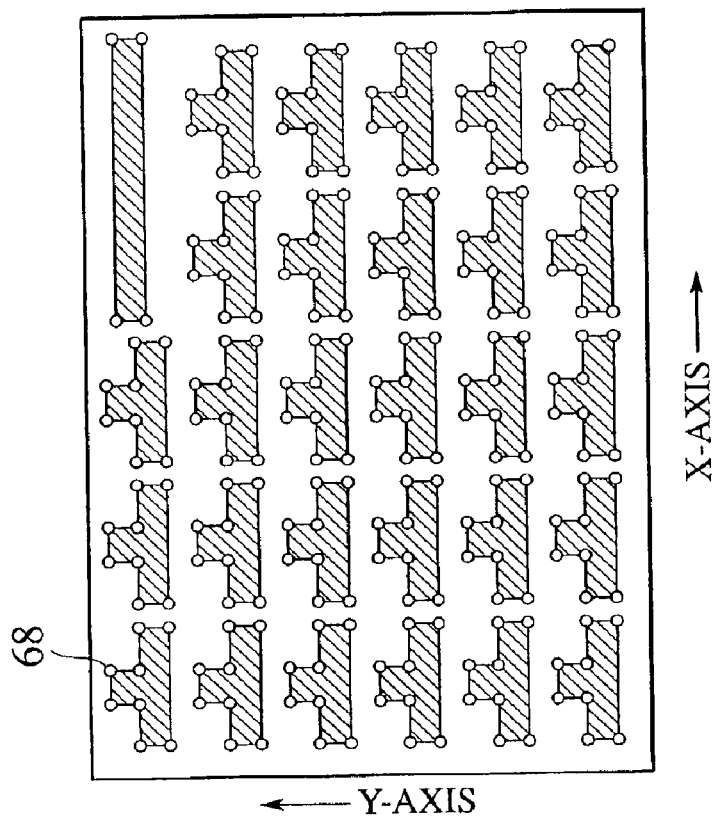
FIG. 13B is a view showing the correction patterns of the array arrangement configuration used in the second embodiment.
Figure 13A:
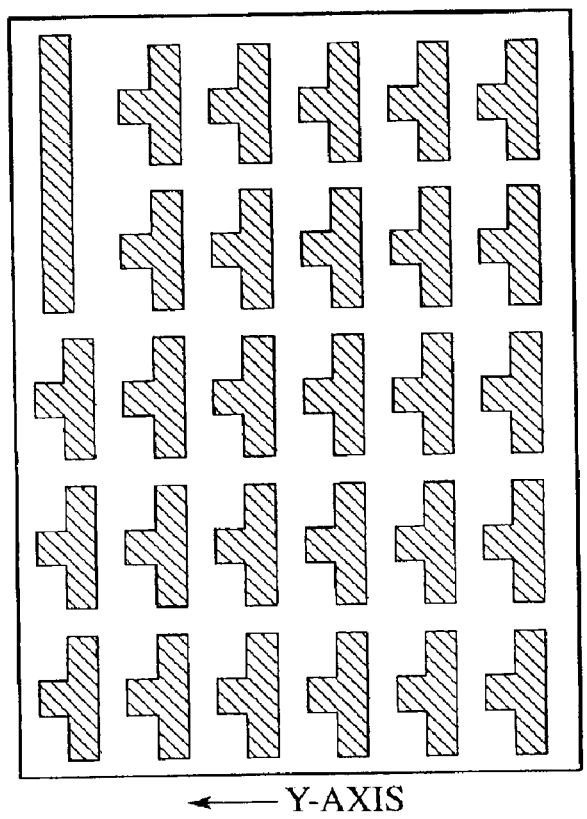
FIG. 13A is a view showing correction patterns of an array arrangement configuration used in the second embodiment.

(b) In Step S202, the patterns to be corrected as shown in FIG. 13A are formed by performing a pattern processing. In Step S203, the first calculated center point calculation module 34 calculates calculated center points 68 for performing a simulation calculation (FIG. 13B).

Figure 14A:
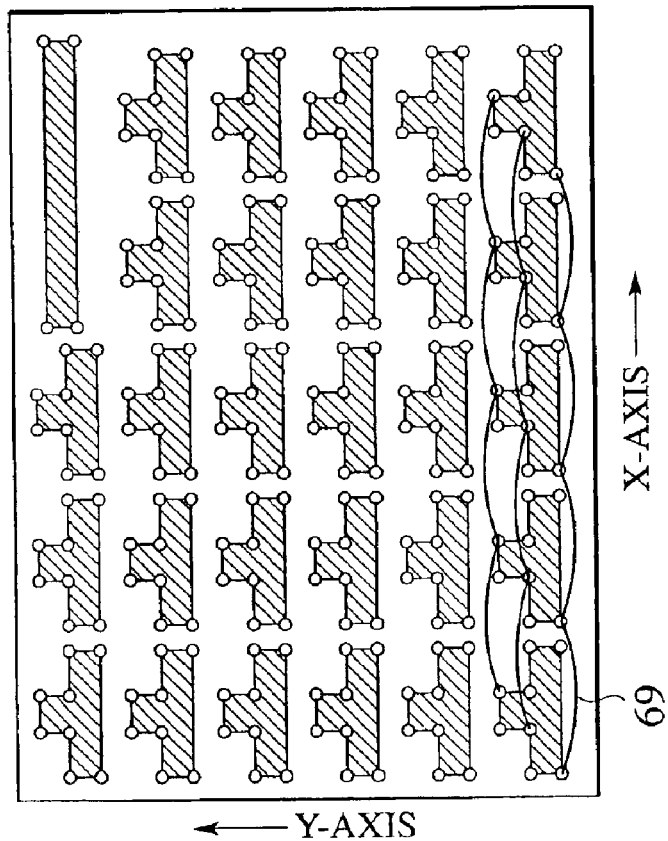
FIG. 14A is a view showing the correction patterns of the array arrangement configuration used in the second embodiment.
Figure 15B:
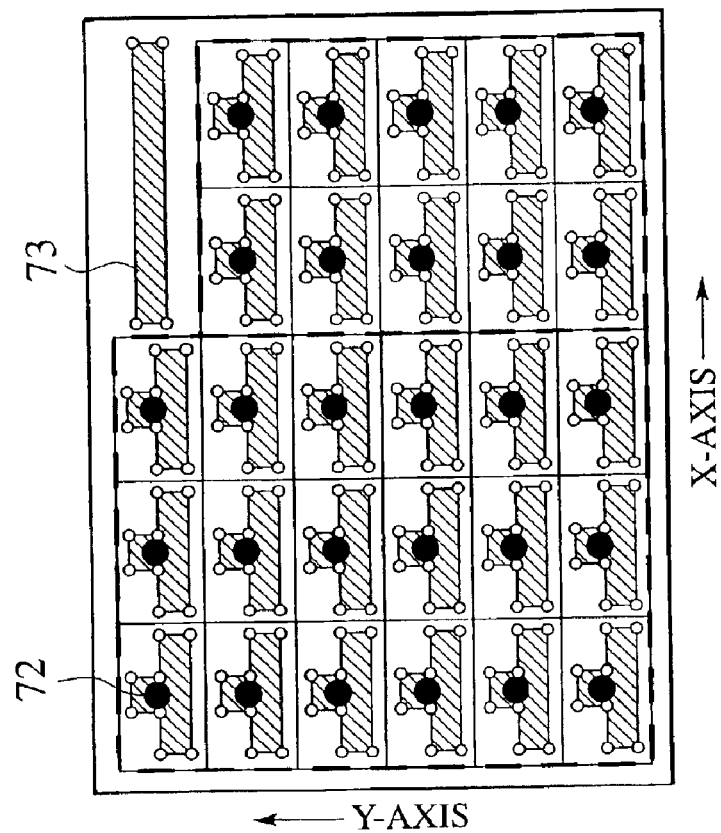
FIG. 15B is a view showing the correction patterns of the array arrangement configuration used in the second embodiment.
Figure 15A:
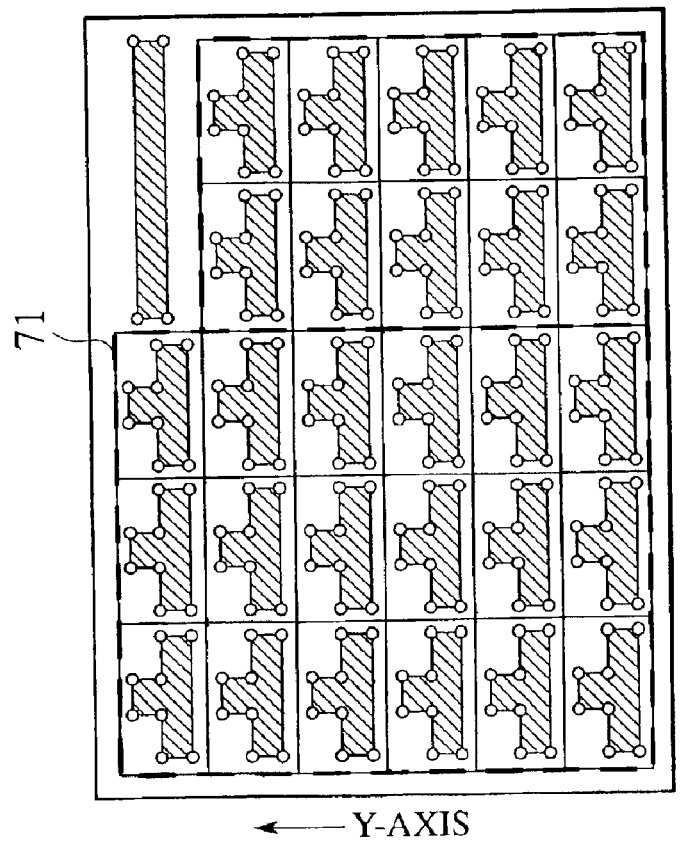
FIG. 15A is a view showing the correction patterns of the array arrangement configuration used in the second embodiment.

(c) Next, in Step S204, the one-dimensional array extraction module 38a checks the periodicity 69 of the respective first calculated center points arranged in the X-axis direction as shown in FIG. 14A, and extracts the ones having the same periodicity as the one-dimensional array. FIG. 14A shows a view where three points 69a,69b,69c out of the respective first calculated center points are checked for the periodicity. Moreover, in Step S205, as shown in FIG. 14B, the two-dimensional array extraction module 38b checks the periodicity 70 of the respective first calculated center points arranged in the Y-axis direction with respect to the one-dimensional array, and extracts the ones having the same periodicity as the two-dimensional array. FIG. 14B shows a view, which shows the situation where three points 69a,69b, 69c out of the first calculated center points are checked for the periodicity. As shown in FIG. 15A, the third rectangular region preparation module 38d reconfigures the arrays in consideration for the above-described periodicities and array pitches, thus preparing the plurality of third rectangular regions (arrayed cell outlines) 71.

(d) Next, in Step S206, the arrayed second calculated center point calculation module 38c calculates and arranges each of the second calculated center points 72 at the center of each of the third rectangular regions 71. Then, in Step S207, the pattern and the first calculated center points, which are not included in the array regions, are extracted. Based on these first calculated center points of the pattern 73, which are not included in the array regions, the processing similar to that in the Steps S104 to S111 of the first embodiment is executed for Steps S208 to S215 in which the second calculated center points are acquired. Thus, description thereof will be omitted.

(e) After finishing the processing of the third rectangular regions for all the array regions, in Step S216, the process simulation execution module 39 and the array process simulation execution module 40 perform the process simulation for the simulation regions taking the second calculated center points as the center, respectively. Thereafter, in Step S217, the correction pattern preparation module 33 calculates the correction values of the edges of each correction pattern and performs the pattern processing in which the acquired correction values are applied to the edges of each correction pattern. Accordingly, error amounts and the like are calculated based on simulation images composed of transfer positions of the prepared correction patterns, and evaluation and verification for transfer shapes is performed. After finishing the entire pattern processing, the operations of the mask data creation are completed.

In the second embodiment, since the size of the arrayed third rectangular regions (cells) is substantially smaller than the size of the regions for performing the process simulation, the new calculated center points are arranged in the centers of the arrayed regions, respectively. When the size of the arrayed third rectangular regions is not substantially smaller than the size of the regions for performing the process simulation, a plurality of calculated center points can be arranged in such a manner that the simulation regions cover the patterns in the cells. Moreover, when the size of the arrayed third rectangular regions is much smaller than the size of the regions for performing the process simulation, a calculated center point can be arranged at the center of the region in which the plurality of third rectangular regions are compiled.

Moreover, for regions having array structures in design data, such as a memory cell and its peripheral portion, grouping of calculated center points can be performed particularly efficiently. Furthermore, because of the grouping which is performed based on array arrangement, the regions with the same arrangement are compiled by performing pattern matching after the grouping, and thus the number of times of actually performing the simulation calculation can be reduced and the calculation time can be shortened. The effect of the reduction depends on a proportion occupied by the regions having the array structures or by regions in which the array structures are partially developed by a hierarchy processing. The effect is particularly noticeable in such array regions as those in FIGS. 15A and 15B.

Various modifications will become possible for those skilled in the art after receiving the teachings of the present disclosure without departing from the scope thereof. The present disclosure is therefore to be considered in all illustrative and not restrictive, the scope of the present invention being indicated by the appended claims rather than by the foregoing description, and all changes which come within the meaning and range of equivalency of the claims are therefore intended to be embraced therein.

What is claimed is:

1. A mask data generating apparatus, comprising:
  a division module configured to extract a line segment to be corrected from a design pattern and to divide the extracted line segment into a length suitable for correction;
  a correction value calculation module configured to calculate correction value calculating points from each divided section of the extracted line;
  a first calculated center point calculation module configured to set first calculated center points based on the correction value calculating points and a shape of a pattern to be corrected;
  a first rectangular region preparation module configured to define a plurality of first simulation regions, each of which takes the calculated center point as the center thereof, and to overlap partially two or more of the first simulation regions with each other so as to define a plurality of first rectangular regions by the partially overlapped regions and a remaining region of one of the first simulation regions not partially overlapped by another one of the first simulation regions;

a second calculated center point calculation module configured to acquire second rectangular regions by selecting at least one of the partially overlapped regions, and to calculate second calculated center points based on the second rectangular regions wherein for calculating the second calculated center point, the second rectangular region is selected as the one of the first rectangular regions with the largest number, arranged in descending order, of the first simulation regions overlapping each other;

a simulation region preparation module configured to acquire second simulation regions based on the second calculated center points;

a process simulation execution module configured to calculate a correction value at each correction value calculating point by using a process simulation in each of the second simulation regions; and a correction pattern preparation module configured to prepare the correction pattern by performing pattern data processing with respect to each edge of the correction pattern by use of the correction value.

2. The mask data generating apparatus of claim 1, wherein the simulation region preparation module includes:

an optical proximity effect range determination module configured to determine a range of optical proximity effect;

a second region radius determination module configured to determine a second region radius to prepare a second simulation region where the process simulation is performed in accordance with capacity of an arithmetic unit and a scale of the design pattern; and a first region radius determination module configured to determine a first region radius to prepare a region including two or more of the first calculated center points based on the range of the optical proximity effect and the second simulation region.

3. The mask data generating apparatus of claim 1, further comprising:

at least one one-dimensional array extraction module configured to investigate a periodicity of the patterns to be corrected in the one-dimensional direction, and to extract the patterns to be corrected, which are arranged with the periodicity, as one of said at least one one-dimensional arrays;

at least one two-dimensional array extraction module configured to investigate a periodicity of the patterns to be corrected in the two-dimensional direction, and to extract the patterns to be corrected, which are arranged with the periodicity, as one of said at least one two-dimensional arrays;

a third rectangular region preparation module configured to constitute an array region by use of said at least one one-dimensional and two-dimensional arrays, and to prepare a plurality of third rectangular regions in the array region in consideration for an array pitch, the first simulation region, and the second simulation region;

an arrayed second calculated center point calculation module configured to calculate a second calculated center point based on the third rectangular regions; and an array process simulation execution module configured to calculate correction values of respective correction value calculating points by using the process simulation in a plurality of third simulation regions, each of which takes the arrayed second calculated center point as center point of said each of a plurality of third simulation regions.

4. The mask data generating apparatus of claim 1, wherein the first rectangular region changes shape of said first rectangular region in accordance with a position where the first calculated center point exists, and the second rectangular region changes shape of said second rectangular region in accordance with the shape of the first rectangular region.

5. The mask data generating apparatus of claim 1, wherein the correction pattern preparation module calculates a transfer position of the correction pattern in transferring the correction pattern onto a mask for each of the correction value calculating points, acquires a difference between the correction pattern and a transfer shape thereof, which is prepared by the transfer position, as error information, and evaluation and verification of the correction pattern based on information including the error information is performed.

6. A method for generating a mask data, comprising:

extracting a line segment to be corrected from a design pattern and dividing the extracted line segment into a length suitable for correction;

calculating correction value calculating points from each divided section of the extracted line;

setting first calculated center points based on the correction value calculating points and a shape of a pattern to be corrected;

defining a plurality of first simulation regions, each of which takes the calculated center point as the center thereof, and overlapping partially two or more of the first simulation regions with each other so as to define a plurality of first rectangular regions by the partially overlapped regions and a remaining region of one of the first simulation regions not partially overlapped by another one of the first simulation regions;

acquiring second rectangular regions by selecting at least one of the partially overlapped regions, and calculating second calculated center points based on the second rectangular regions wherein for calculating the second calculated center point, the second rectangular region is selected as the one of the first rectangular regions with the largest number, arranged in descending order, of the first simulation regions overlapping each other;

acquiring second simulation regions based on the second calculated center points;

calculating a correction value at each correction value calculating point by using a process simulation in each of the second simulation regions; and preparing the correction pattern by performing pattern data processing with respect to each edge of the correction pattern by use of the correction value.

7. The method of claim 6, wherein preparing the second simulation regions includes:

determining a range of optical proximity effect;

determining a second region radius for preparing a second simulation region where the process simulation is performed in accordance with capacity of an arithmetic unit and a scale of the design pattern; and determining a first region radius to prepare a region including two or more of the first calculated center points based on the range of the optical proximity effect and the second simulation region.

8. The method of claim 6, further comprising:
investigating a periodicity of the patterns to be corrected in a one-dimensional direction, and extracting the patterns to be corrected, which are arranged with the periodicity, as at least one of one-dimensional arrays;
investigating a periodicity of the patterns to be corrected in a two-dimensional direction, and extracting the patterns to be corrected, which are arranged with the periodicity, as at least one of two-dimensional arrays;
constituting an array region by use of the one-dimensional and two-dimensional arrays, and preparing a plurality of third rectangular regions in the array region in consideration for an array pitch, the first simulation region and the second simulation region;
calculating an array second calculated center point based on the third rectangular regions; and
calculating correction values of respective correction value calculating points by using the process simulation in a plurality of third simulation regions, each of which takes the arrayed second calculated center point as center point of said each of said a plurality of third simulation regions.

9. The method of claim 6, wherein the first rectangular region changes shape of said first rectangular region in accordance with a position where the first calculated center point exists, and the second rectangular region changes shape of said second rectangular region in accordance with the shape of the first rectangular region.

10. The method of claim 6, wherein preparing the correction pattern includes:
calculating a transfer position of the correction pattern in transferring the correction pattern onto a mask for each of the correction values calculating points;
acquiring a difference between the correction pattern and a transfer shape, which is prepared by the transfer position, as error information; and
performing evaluation and verification of the correction pattern based on information including the error information.

11. A computer program in a computer memory configured to generate mask data, the computer program causing a computer to execute instructions for:
extracting a line segment to be corrected from a design pattern and dividing the extracted line segment into a length suitable for correction;
calculating correction value calculating points from each divided section of the extracted line;
setting first calculated center points based on the correction value calculating points and a shape of a pattern to be corrected;
defining a plurality of first simulation regions, each of which takes the calculated center point as the center thereof, and overlapping partially two or more of the first simulation regions with each other so as to define a plurality of first rectangular regions by the partially overlapped regions and a remaining region of one of the first simulation regions not partially overlapped by another one of the first simulation regions;
acquiring second rectangular regions by selecting at least one of the partially overlapped regions, and calculating second calculated center points based on the second rectangular regions wherein the instruction for calculating the second calculated center point performs selecting of the second rectangular region as the one of the first rectangular regions with the largest number, arranged in descending order, of the first simulation regions overlapping each other;
acquiring second simulation regions based on the second calculated center points;
calculating a correction value at each correction value calculating point by using a process simulation in each of the second simulation regions; and
preparing the correction pattern by performing pattern data processing with respect to each edge of the correction pattern by use of the correction value.

12. The program of claim 11, wherein the instruction of preparing the second simulation regions includes the instructions of;
determining a range of optical proximity effect;
determining a second region radius for preparing a second simulation region where the process simulation is performed in accordance with capacity of an arithmetic unit and a scale of the design pattern; and
determining a first region radius for preparing a region including two or more of the first calculated center points based on the range of the optical proximity effect and the second simulation region.

13. The program of claim 11, further comprising the instructions of:
investigating a periodicity of the patterns to be corrected in a one-dimensional direction, and extracting the patterns to be corrected, which are arranged with the periodicity as at least one of one-dimensional arrays;
investigating a periodicity of the patterns to be corrected in a two-dimensional direction, and extracting the patterns to be corrected, which are arranged with the periodicity, as at least one of two-dimensional arrays;
constituting an array region by use of the one-dimensional and two-dimensional arrays, and preparing a plurality of third rectangular regions in the array region in consideration for an array pitch, the first simulation region and the second simulation region;
calculating an array second calculated center point based on the third rectangular regions; and
calculating correction values of respective correction value calculating points by using the process simulation in a plurality of third simulation regions, each of which takes the arrayed second calculated center point as center point of said each of said a plurality of third simulation regions.

14. The program of claim 11, wherein the first rectangular region changes shape of said first rectangular region in accordance with a position where the first calculated center point exists, and the second rectangular region changes shape of said second rectangular region in accordance with the shape of the first rectangular region.

15. The program of claim 11, wherein the instruction for preparing the correction pattern calculates a transfer position of the correction pattern in transferring the correction pattern onto a mask for each of the correction value calculation points, acquires a difference between the correction pattern and a transfer shape thereof, which is prepared by the transfer position as error information, and performs evaluation and verification of the correction pattern based on information including the error information.

* * * * *